(12) United States Patent
Taniguchi et al.

(10) Patent No.: US 12,313,695 B2
(45) Date of Patent: May 27, 2025

(54) BATTERY MONITORING SYSTEM

(71) Applicants: DENSO CORPORATION, Kariya (JP); TOYOTA JIDOSHA KABUSHIKI KAISHA, Toyota (JP); MIRISE Technologies Corporation, Nisshin (JP)

(72) Inventors: Soya Taniguchi, Nisshin (JP); Yoshikazu Furuta, Nisshin (JP); Kazuo Matsukawa, Kariya (JP); Yoshiyuki Utagawa, Kariya (JP)

(73) Assignees: DENSO CORPORATION, Kariya (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 279 days.

(21) Appl. No.: 17/968,877

(22) Filed: Oct. 19, 2022

(65) Prior Publication Data
US 2023/0126560 A1  Apr. 27, 2023

(30) Foreign Application Priority Data
Oct. 22, 2021 (JP) ................. 2021-173211

(51) Int. Cl.
*G01R 31/396* (2019.01)
*G01R 31/382* (2019.01)
(Continued)

(52) U.S. Cl.
CPC ......... *G01R 31/396* (2019.01); *G01R 31/382* (2019.01); *H01M 10/425* (2013.01);
(Continued)

(58) Field of Classification Search
CPC . G01R 31/396; G01R 31/382; H01M 10/425; H01M 2010/4278; H01M 2010/4271; H03K 21/40
See application file for complete search history.

(56) References Cited

U.S. PATENT DOCUMENTS 4,217,645 A * 8/1980 Barry ................... G01R 31/379
324/426
9,167,317 B2 * 10/2015 DeMar ..................... H04Q 9/00
(Continued)

FOREIGN PATENT DOCUMENTS

JP     2004-282441 A    10/2004
JP     2020021637 A     2/2020

OTHER PUBLICATIONS

Kincaid, L. "Analog Devices Expands BMS Portfolio to Enable Continuous Battery Monitoring", Analog Devices, May 26, 2021, https://www.analog.com/en/about-adi/news-room/press-releases/2021/5-26-2021-analog-devices-expands-bms-portfolio-enable-continuous-battery-monitoring.html.

*Primary Examiner* — Elias Desta
(74) *Attorney, Agent, or Firm* — Posz Law Group, PLC (57) ABSTRACT

A battery monitoring system includes a battery monitoring ECU and battery monitoring devices which are sequentially connected in a connection configuration. The battery monitoring ECU includes a clock generator that generates a first clock signal. Each battery monitoring device includes a second clock generator that generates a second clock signal, a controller that causes a frequency correction block to correct a frequency of the second clock signal in line with the first clock signal and causes the battery monitor to monitor a battery cell using the second clock signal that has been corrected, and a switch that, according to an instruction of the battery monitoring ECU, switches a circuit configuration to a state in which a signal received from a preceding (Continued)

device is transmitted to a succeeding device in the connection configuration.

9 Claims, 9 Drawing Sheets

(51) Int. Cl.
    *H01M 10/42*     (2006.01)
    *H03K 21/40*     (2006.01)

(52) U.S. Cl.
    CPC ..... *H03K 21/40* (2013.01); *H01M 2010/4271* (2013.01); *H01M 2010/4278* (2013.01)

(56) References Cited

U.S. PATENT DOCUMENTS

| | | | |
|---|---|---|---|
| 9,720,478 B2* | 8/2017 | Hanafusa | H02J 13/00022 |
| 2008/0048662 A1* | 2/2008 | Hirsch | G01R 31/389 |
| | | | 324/430 |
| 2019/0086475 A1 | 3/2019 | Takeshita | |
| 2021/0156927 A1 | 5/2021 | Hatani et al. | |

* cited by examiner

BATTERY MONITORING SYSTEM

CROSS REFERENCE TO RELATED APPLICATION

This application is based on and incorporates herein by reference Japanese Patent Application No. 2021-173211 filed on Oct. 22, 2021.

TECHNICAL FIELD

The present disclosure relates to a battery monitoring system.

BACKGROUND

In recent years, mobile objects such as vehicles and flying objects using a secondary battery are increasing. There is an increasing demand for a battery monitoring system (i.e., battery management system: BMS) that measures electrical characteristics of a secondary battery to acquire a state of the inside of the battery, such as a remaining battery capacity (i.e., state of charge: SOC) of the secondary battery.

SUMMARY

According to an aspect of the present disclosure, a battery monitoring system for monitoring states of battery cells includes a battery monitoring ECU and battery monitoring devices. The battery monitoring ECU and the battery monitoring devices are connected in a connection configuration which is ring connection, daisy chain connection, or multi-drop connection. The battery monitoring ECU includes a clock generator that generates a first clock signal, and a transceiver that transmits a signal from which the first clock signal is specified and an instruction regarding monitoring of the battery cells to at least one of the battery monitoring devices, and receives a result of the instruction from at least one of the battery monitoring devices. Each battery monitoring device includes a receiver that receives a signal from a preceding device in the connection configuration, a second clock generator that generates a second clock signal used as a reference of an operation of the battery monitoring device, a frequency correction block that corrects a frequency of the second clock signal, a battery monitor that monitors a battery cell using the second clock signal, a controller that causes the frequency correction block to correct the frequency of the second clock signal in line with the first clock signal according to the signal received via the receiver and causes the battery monitor to monitor the battery cell using the second clock signal that has been corrected by the frequency correction block, a transmitter that transmits a monitoring result of the battery cell to a succeeding device in the connection configuration, and a switch that, according to the instruction from the battery monitoring ECU, switches a circuit configuration to a state in which a signal received from the preceding device is transmitted to the succeeding device.

BRIEF DESCRIPTION OF DRAWINGS

The details of one or more embodiments are set forth in the accompanying drawings and the description below. Other features and advantages will be apparent from the description and drawings, and from the claims.

DETAILED DESCRIPTION

To begin with, examples of relevant techniques will be described. A battery monitoring system according to a comparative example includes batteries monitored by battery monitoring ICs, and the battery monitoring ICs are daisy-chained. Such a battery monitoring system is provided with a battery monitoring ECU that controls the entirety of the battery monitoring system. According to an instruction output from the battery monitoring ECU to the first battery monitoring device, each of daisy-chained battery monitoring devices adds its own data to information received from a preceding battery monitoring device and sends it to a succeeding battery monitoring device. Then, the final battery monitoring device outputs all the information to the battery monitoring ECU.

However, since each battery monitoring device has an oscillator and operates using its oscillation frequency, a precision of highly-precise data regarding operation timing may not be maintained at the time of each of the daisy-chained battery monitoring devices transmitting the data. For example, when each battery monitoring device measures an AC impedance, a high-precision oscillator may be provided in the battery monitoring ECU to output precise timing data to the battery monitoring devices in order to increase the precision of the frequency used for the measurement by each battery monitoring device. In this case, when each battery monitoring device sends the timing data received from the battery monitoring ECU to the succeeding battery monitoring device through a daisy chain connection, errors associated with receiving and transmitting by the battery monitoring device may be superimposed. Thus, the errors may be accumulated in the timing data as the timing data is transmitted to succeeding devices.

According to an aspect of the present disclosure, a battery monitoring system for monitoring states of battery cells includes a battery monitoring ECU and battery monitoring devices. The battery monitoring ECU and the battery monitoring devices are connected in a connection configuration which is ring connection, daisy chain connection, or multidrop connection. The battery monitoring ECU includes a clock generator that generates a first clock signal, and a transceiver that transmits a signal from which the first clock signal is specified and an instruction regarding monitoring of the battery cells to at least one of the battery monitoring devices, and receives a result of the instruction from at least one of the battery monitoring devices. Each battery monitoring device includes a receiver that receives a signal from a preceding device in the connection configuration, a second clock generator that generates a second clock signal used as a reference of an operation of the battery monitoring device, a frequency correction block that corrects a frequency of the second clock signal, a battery monitor that monitors a battery cell using the second clock signal, a controller that causes the frequency correction block to correct the frequency of the second clock signal in line with the first clock signal according to the signal received via the receiver and causes the battery monitor to monitor the battery cell using the second clock signal that has been corrected by the frequency correction block, a transmitter that transmits a monitoring result of the battery cell to a succeeding device in the connection configuration, and a switch that, according to the instruction from the battery monitoring ECU, switches a circuit configuration to a state in which a signal received from the preceding device is transmitted to the succeeding device. According to the battery monitoring system, errors in frequency can be prevented from being accumulated. As a result, the battery monitoring system including the multiple battery monitoring devices can synchronize oscillation frequencies among the battery monitoring devices at low cost.

The present disclosure can be realized as the following embodiments. For example, it can be implemented in a battery monitoring method or the like.

Hereinafter, multiple embodiments for implementing the present disclosure will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

Configuration of Battery Monitoring System 100

Figure 1:
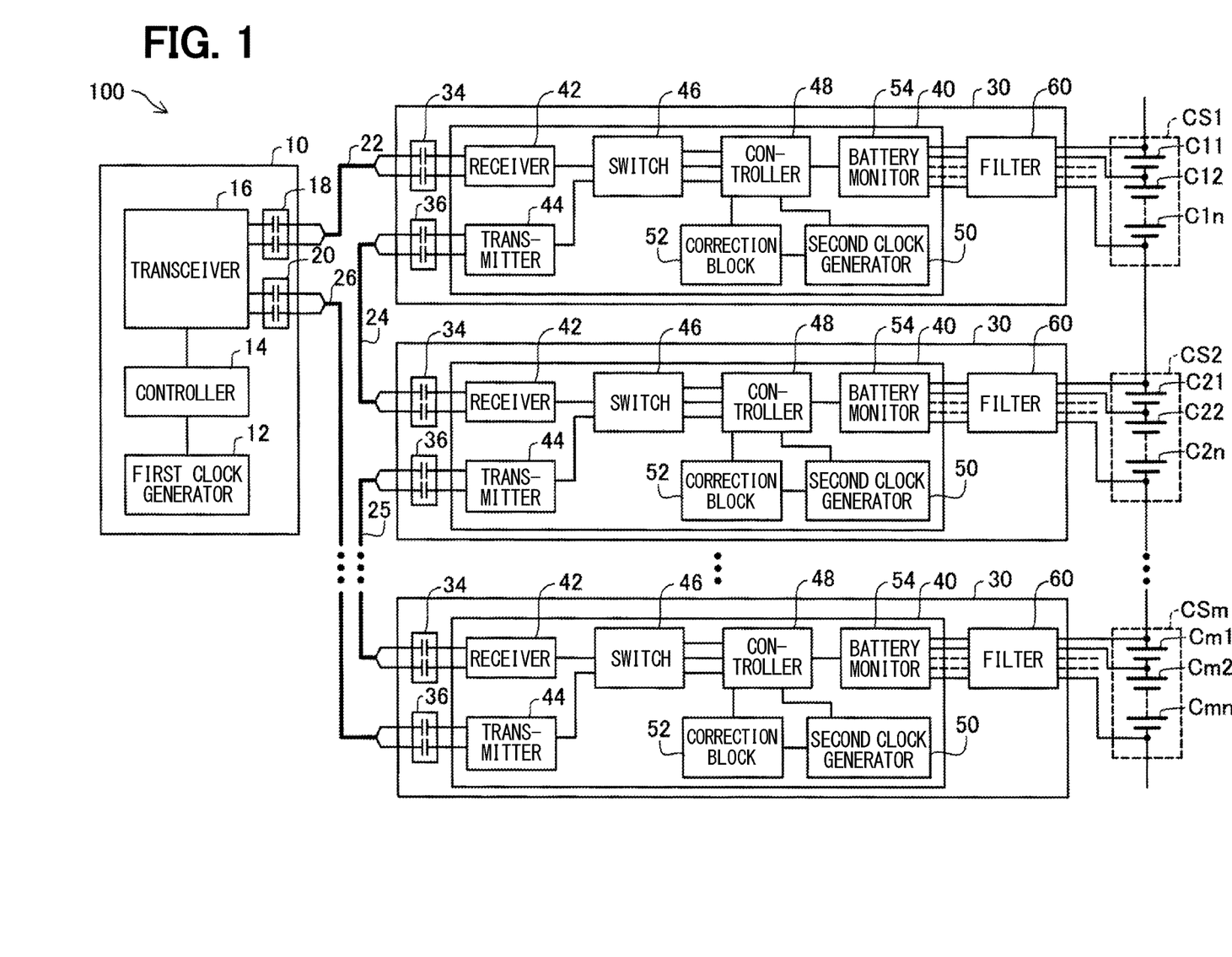
FIG. 1 is a schematic diagram illustrating a battery monitoring system according to a first embodiment.

As illustrated in FIG. 1, a battery monitoring system 100 includes a battery monitoring ECU 10 and battery monitoring devices 30. In the present embodiment, the number of the battery monitoring devices is m, where m is an integer of 2 or more. Each battery monitoring device 30 includes one cell stack CSx, where x is any one of 1 to m. Each cell stack CSx includes a secondary cell (hereinafter referred to as "battery cell"), and the number of the battery cell is n, where n is an integer of 1 or more. Each battery monitoring device 30 monitors a state of the battery cell included in the cell stack CSx. Therefore, the battery monitoring system 100 monitors states of battery cells C11 to Cmn. In the present embodiment, the total number of the battery cells included in the battery monitoring system 100 is m×n. In the present embodiment, the number of the battery cell monitored by each battery monitoring device 30 is n, in other words, the battery monitoring devices 30 monitor the same number (i.e., n) of the battery cell. However, the battery monitoring devices 30 may monitor different numbers of the battery cell.

The battery monitoring ECU 10 includes two connectors 18 and 20, and each battery monitoring device 30 includes two connectors 34 and 36. The battery monitoring ECU 10 and the battery monitoring devices 30 are connected to form a ring connection as an example of a connection configuration. That is, one connector 18 of the battery monitoring ECU 10 is connected to one connector 34 of a first battery monitoring device 30 via a transmission path 22. The other connector 36 of the first battery monitoring device 30 is connected to one connector 34 of a second battery monitoring device 30 via a transmission path 24. The other connector 36 of the second battery monitoring device 30 is connected to one connector 34 of a third battery monitoring device 30 via a transmission path 25. Then, until a final battery monitoring device 30, a connector 36 of the preceding device 30 is connected to a connector 34 of the present device 30 via a transmission path. Another connector 36 of an mth battery monitoring device 30, i.e., the final battery monitoring device 30 is connected to the other connector 20 of the battery monitoring ECU 10 via a transmission path 26. In this manner, the battery monitoring ECU 10 and the battery monitoring devices 30 are connected to each other so as to form one ring.

Although details will be described later, the battery monitoring ECU 10 operates based on a first clock signal generated by itself, and each battery monitoring device 30 operates based on a second clock signal generated by itself. The battery monitoring device 30 has two operation modes: a correction mode and a measurement mode, which are switched according to instructions from the battery monitoring ECU 10. The correction mode is an operation mode for correcting the second clock signal to be synchronized with the first clock signal. The measurement mode is an operation mode for acquiring a state of the battery cell using the second clock signal.

In the correction mode, the battery monitoring device 30 receives a first superimposed signal from a preceding device in the ring connection. The first superimposed signal is a signal in which clock frequency information and battery monitoring information are superimposed on the first clock signal. The battery monitoring device 30 generates a reference clock signal from the first superimposed signal. The reference clock signal is the same as the first clock signal in frequency. The battery monitoring device 30 synchronizes the second clock signal generated by itself with the reference clock signal so that the second clock signal becomes the same as the reference clock signal in frequency. As a result, the second clock signal is synchronized with the first clock signal. Further, in the correction mode, the battery monitoring device 30 transmits the first superimposed signal received from the preceding device to a succeeding device in the ring connection as it is.

On the other hand, in the measurement mode, each battery monitoring device 30 measures (i.e., acquires) the state of the battery cell by using the self-generated second clock signal. The state of the battery cell is, for example, a remaining capacity (i.e., state of charge: SOC) of n battery cells included in the cell stack connected to the battery monitoring device 30. The battery monitoring device 30 generates a second superimposed signal, and transmits the second superimposed signal to the succeeding device in the ring connection. The second superimposed signal is a signal in which a measurement result, i.e., the measured state of the battery cell in the battery monitoring device 30 and measurement results of the first to preceding devices in the ring connection are superimposed on the second clock signal.

Hereinafter, configurations of the battery monitoring ECU 10 and the battery monitoring devices 30 will be described. The battery monitoring ECU 10 includes a first clock generator 12, a controller 14, a transceiver 16, and the connectors 18 and 20. The first clock generator 12 generates a first clock signal that is a basis of operation of the battery monitoring ECU 10. The first clock generator 12 generates the first clock signal which is a highly precise clock signal by using a crystal oscillator. The first clock generator 12 may use an oscillator other than crystal oscillator. For example, a silicon MEMS oscillator may be used. Alternatively, the first clock generator 12 may generate the first clock signal by receiving a signal generated by a GNSS reference frequency generator from a GNSS satellite.

The controller 14 generates a first superimposed signal in which clock frequency information and battery monitoring information are superimposed on the first clock signal, and then sends the first superimposed signal to the transceiver 16. The clock frequency information is information indicating the frequency of the first clock signal. The battery monitoring information includes information for specifying a battery cell to be monitored by the battery monitoring device 30. The battery monitoring information further includes a mode switching instruction causing the battery monitoring device 30 to transition to the correction mode or the measurement mode. The battery monitoring device 30 performs correction of the frequency of the second clock signal in the correction mode while the battery monitoring device 30 monitors the battery cell in the measurement mode. The information specifying the battery cell to be monitored, which is included in the battery monitoring information, indicates which battery cell is to be monitored. The battery cell to be monitored may be one specific battery cell in a specific cell stack, multiple specific battery cells in the specific cell stack, all battery cells in the specific pack, or all battery cells in all cell stacks.

The superimposition of the clock frequency information and the battery monitoring information on the first clock signal is performed by, for example, phase encoding using Manchester code. The superimposition of the battery monitoring information may be performed by a method other than phase coding using Manchester code. For example, phase shift keying may be used.

The transceiver 16 outputs an instruction related to battery monitoring to at least one of the battery monitoring devices 30, and receives a result of the instruction from at least one of the battery monitoring devices 30. The transceiver 16 generates a differential signal from the first superimposed signal and transmits the differential signal to the transmission path 22 via the connector 18. The differential signal is a signal obtained by converting one signal into two signals which are opposite to each other in polarity. Each of the transmission paths 22 and 26 connecting the battery monitoring ECU 10 and a battery monitoring device 30 has two signal lines. Each of the transmission paths 24, 25, . . . , connecting a battery monitoring device 30 and another battery monitoring device 30 also has two signal lines. The transceiver 16 transmits an original signal to one of the two signal lines of the transmission path 22, and transmits a polarity-opposite signal to the other signal line. The polarity-opposite signal is opposite to the original signal in polarity and obtained by inverting HIGH and LOW of the original signal. The connector 18 includes a capacitor, and connects the transceiver 16 and the transmission path 22 via the capacitor. Therefore, the connector 18 transmits only an AC (i.e., alternate current) component without transmitting a DC (i.e., direct current) component of the signal.

The transceiver 16 also receives a differential signal of the second superimposed signal, in which battery monitoring results are superimposed, from the final battery monitoring device 30 via the transmission path 26 and the connector 20, and then decodes the second superimposed signal. The battery monitoring results are results of battery monitoring processing performed by the respective battery monitoring devices 30 based on the battery monitoring information received from the battery monitoring ECU 10. The battery monitoring results include information specifying a monitored battery cell, and a measurement result, i.e., a state of the monitored battery cell. Similarly to the connector 18, the connector 20 includes a capacitor, and connects the transmission path 26 and the transceiver 16 via the capacitor. The connector 20 transmits only an AC component of a signal without transmitting a DC component of the signal. Note that the connectors 18 and 20 may include a transformer in addition to the capacitor.

Each battery monitoring device 30 includes a battery monitoring IC 40 and a filter 60. The battery monitoring IC 40 includes a receiver 42, a transmitter 44, a switch 46, a controller 48, a second clock generator 50, a frequency correction block 52, a battery monitor 54 and the connectors 34, 36. The receiver 42 is connected to the connector 34, and the transmitter 44 is connected to the connector 36. The receiver 42 and the transmitter 44 are connected to the switch 46, and the switch 46 is connected to the controller 48. The controller 48 is connected to the second clock generator 50, the frequency correction block 52, and the battery monitor 54. The battery monitor 54 is connected to the battery cell via the filter 60.

The receiver 42 of the first battery monitoring device 30 is connected to the transceiver 16 of the battery monitoring ECU 10 via the connector 34, the transmission path 22, and the connector 18. The receiver 42 of each of the second to mth battery monitoring devices 30 is connected to the transmitter 44 of the preceding battery monitoring device 30 via the connector 34, the transmission path 24, 25, . . . , and the connector 36. The transmitter 44 of the mth battery monitoring device 30 is connected to the transceiver 16 of the battery monitoring ECU 10 via the connector 36, the transmission path 26, and the connector 20.

The receiver 42 receives a differential signal from the preceding device and decodes a superimposed signal. For the controller 48 of the first battery monitoring device 30, the preceding device is the battery monitoring ECU 10. For the controller 48 of each of the second to mth battery monitoring devices 30, the preceding device is one of battery monitoring devices 30 immediately preceding the battery monitoring device 30 in the connection configuration. The transmitter 44 generates a differential signal from a superimposed signal and transmits the differential signal to a succeeding device. For the controller 48 of each of the first to (m−1)th battery monitoring devices 30, the succeeding device is one of the battery monitoring devices 30 immediately succeeding the battery monitoring device 30 in the connection configuration. For the controller 48 of the mth battery monitoring device 30, the succeeding device is the battery monitoring ECU 10.

The controller 48 generates a reference clock signal from the superimposed signal received by the receiver 42, and decodes the superimposed signal to restore clock frequency information and battery monitoring information. The superimposed signal is either the first superimposed signal or the second superimposed signal. As described above, the first superimposed signal is generated by the battery monitoring ECU 10 and is a signal in which the clock frequency information of the first clock signal and the battery monitoring information are superimposed on the first clock signal. On the other hand, the second superimposed signal is generated by an immediately preceding battery monitoring device 30 and is a signal in which the clock frequency information of the second clock signal, the battery monitoring information, and the battery monitoring results are superimposed on the second clock signal. Whether a battery monitoring device 30 receives the superimposed signal as the first superimposed signal or the second superimposed signal depends on the position of the battery monitoring device 30 and an operation mode of the immediately preceding battery monitoring device 30. Whether the battery monitoring device 30 operates in the correction mode or the measurement mode depends on an instruction of the battery monitoring ECU 10. Switching of this operation mode will be described later.

The first battery monitoring devices 30 receives the first superimposed signal regardless of the operation mode thereof. The second to mth battery monitoring devices 30 receives the first superimposed signal when the immediately preceding battery monitoring device 30 is in the correction mode, and receives the second superimposed signal when the immediately preceding battery monitoring device 30 is in the measurement mode. The controller 48 causes the operation mode of the battery monitoring device 30 to transition to the correction mode or the measurement mode according to the mode switching instruction included in the battery monitoring information superimposed on the superimposed signal. In the correction mode, the controller 48 transmits the first superimposed signal received from the preceding device to the succeeding device. On the other hand, in the measurement mode, the controller 48 generates a second superimposed signal in which clock frequency information, battery monitoring information, and a battery monitoring result are superimposed on a second clock signal. Then, the controller 48 transmits the generated second superimposed signal to the succeeding device via the transmitter 44.

The reference clock signal is obtained by restoring a pre-superimposition clock signal from a received superimposed signal. Therefore, the reference clock signal generated by the first battery monitoring device 30 is the same in frequency as the first clock signal. The reference clock signal generated by each of the second to mth battery monitoring devices 30 is the same in frequency as the first clock signal when the immediately preceding battery monitoring device 30 is in the correction mode, and is the same in frequency as the second clock signal when the immediately preceding battery monitoring device 30 is in the measurement mode.

The second clock generator 50 generates a second clock signal used as a reference of an operation of a battery monitoring device 30 including the second clock generator 50. The second clock generator 50 includes an LC oscillator that is simpler than the crystal oscillator used in the first clock generator 12. Accordingly, the second clock signal is a clock signal with lower precision than the first clock signal. Since the second clock generator 50 uses the LC oscillator, an oscillation frequency can be easily changed and corrected by in accordance with a correction instruction from the frequency correction block 52. For example, the oscillation frequency can be changed and corrected by change in a capacitance of a capacitor constituting the LC oscillator or change in an inductance of an inductor constituting the LC oscillator.

The controller 48 causes the battery monitoring device 30 to transition to the correction mode or the measurement mode according to the mode switching instruction included in the battery monitoring information signal obtained by decoding of the superimposed signal received from the preceding device.

In the correction mode, the controller 48 sends a correction instruction to the frequency correction block 52 to correct the second clock signal generated by the second clock generator 50 so that the frequency of the second clock signal generated by the second clock generator 50 matches the frequency of the reference clock signal, i.e., the frequency of the first clock signal. Upon receiving the correction instruction from the controller 48, the frequency correction block 52 detects a frequency difference between the signal received from the preceding device and the second clock signal, and then instructs the second clock generator 50 to correct the oscillation frequency of the second clock signal. The frequency correction block 52 uses a counter method as a correction method for correcting the second clock signal. Hence, the frequency correction block 52 uses a difference in count value between the reference clock signal generated by the controller 48 from the superimposed signal and the second clock signal generated by the second clock generator 50. The frequency correction block 52 corrects the oscillation frequency of the second clock generator 50 so that the difference in count value becomes zero. Further, in the correction mode, the controller 48 instructs the switch 46 to switch the communication path so that the superimposed signal received from the preceding device is transmitted to the succeeding device.

In the measurement mode, the controller 48 instructs the battery monitor 54 to monitor a battery cell specified by the battery monitoring information, and acquires a measurement result of the state of the battery cell. The battery monitor 54 detects the state of the battery cell by an AC impedance method using the second clock signal. The controller 48 may instruct the battery monitor 54 to constantly monitor the state of the battery cell, and when the battery monitoring information includes information on the specified battery cell, the controller 48 may acquire a measurement result of the state of the battery cell. The controller 48 generates a second superimposed signal in which clock frequency information, battery monitoring information, and a measurement result of the monitored battery cell are superimposed on the second clock signal. Then, the controller 48 transmits the generated second superimposed signal to the switch 46. The controller 48 instructs the switch 46 to switch the communication path so as to transmit the generated second superimposed signal to the transmitter 44.

The switch 46 is arranged between the receiver 42 and the controller 48 and between the transmitter 44 and the controller 48. The switch 46 switches a signal to be transmitted to the transmitter 44 between a superimposed signal received from the preceding device, i.e., a signal received from the receiver 42 and the second superimposed signal received from the controller 48. The switch 46 performs the switching of the signal while maintaining the connection configuration between the battery monitoring ECU 10 and the battery monitoring devices 30. In the correction mode, the switch 46 selects the signal to be transmitted to the transmitter 44 as the superimposed signal received from the preceding device. On the other hand, in the measurement mode, the signal transmitted to the transmitter 44 is the second superimposed signal received from the controller 48.

Figure 2:
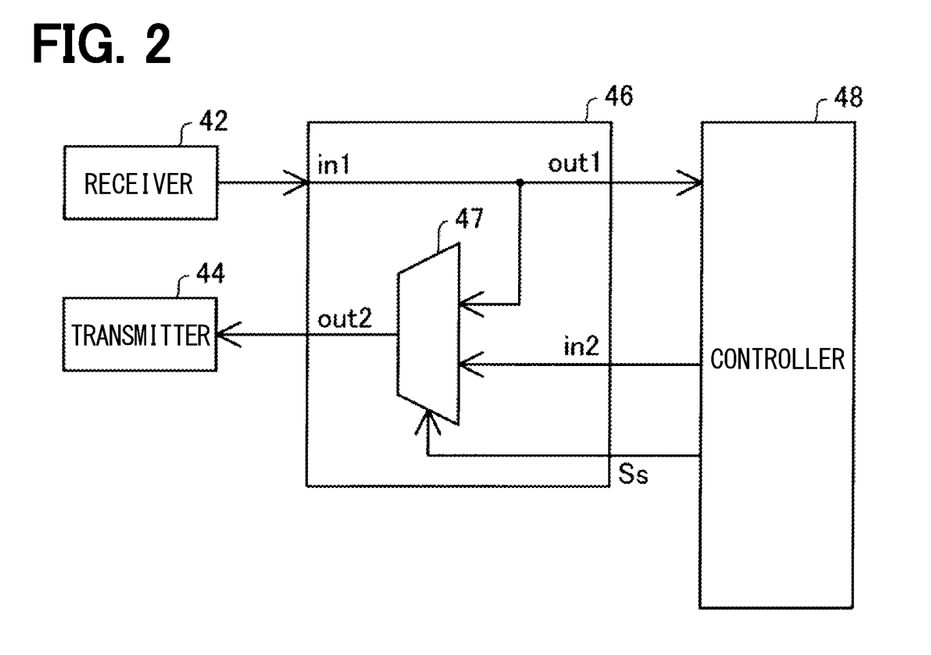
FIG. 2 is a schematic diagram illustrating a configuration of a switch.

FIG. 2 is a schematic diagram illustrating a configuration of the switch 46. The switch 46 includes two inputs in1, in2, two outputs out1, out2, and a selector 47. An input in1 is connected to the receiver 42, and an input in2 and an output out1 are connected to the controller 48. An output out2 is connected to the transmitter 44. A signal input to the switch 46 through the input in1 from the receiver 42 is branched into two. One of the branched signals is directly output from the output out1 and transmitted to the controller 48. The other of the branched signals from the input in1 is input to the selector 47. A signal input to the switch 46 through the input in2 from the controller 48 is input to the selector 47. A signal output from the selector 47 is output from the output out2 and transmitted to the transmitter 44. A switching signal Ss is generated by the controller 48 and input to the switch 46. For example, the switching signal Ss is at a "H" level in the correction mode and a "L" level in the measurement mode. When the switching signal Ss is at the "H" level, the selector 47 outputs the superimposed signal input through the input in1. On the other hand, when the switching signal Ss is at "L" level, the selector 47 outputs the second superimposed signal received from the controller 48.

Operation of Battery Monitoring System 100

Figure 3:
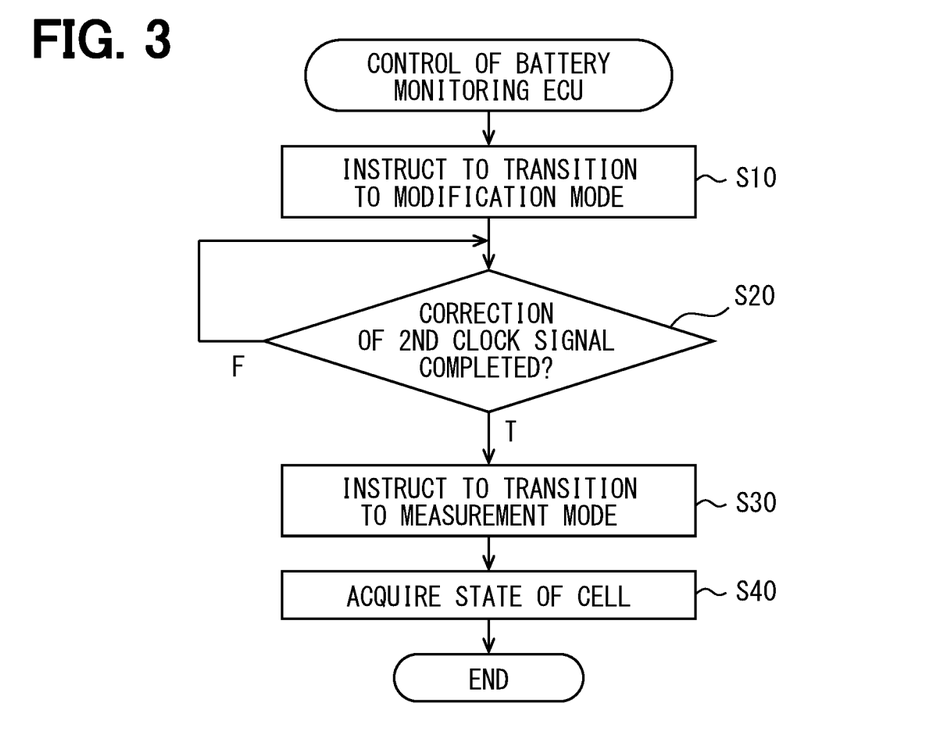
FIG. 3 is a flowchart of a process in a controller of the battery monitoring system.

FIG. 3 is a flowchart of a process in a controller 14 of the battery monitoring system 100. At step S10, the controller 14 of the battery monitoring ECU 10 instructs all the battery monitoring devices 30 to transition to the correction mode. More specifically, the controller 14 of the battery monitoring ECU 10 transmits a first superimposed signal as the mode switching instruction to the first battery monitoring device 30. The first superimposed signal is a signal in which battery monitoring information is superimposed, and the battery monitoring information includes an instruction causing the battery monitoring device 30 to transition to the correction mode in which the frequency of the second clock signal is corrected. When the first battery monitoring device 30 transitions to the correction mode, the switch 46 of the first battery monitoring device 30 is switched to transmit the first superimposed signal as the superimposed signal from the preceding device to the succeeding device. As a result, the first superimposed signal is transmitted to the second battery monitoring device 30. Similarly, when the second battery monitoring device 30 transitions to the correction mode, the switch 46 of the second battery monitoring device 30 is switched to transmit the superimposed signal from the preceding device to the succeeding device. As a result, the first superimposed signal is transmitted to the third battery monitoring device 30. Similarly, the first superimposed signal is consecutively transmitted to the succeeding battery monitoring devices 30. When the first superimposed signal is returned from the final battery monitoring device 30 to the battery monitoring ECU 10, transition of all the battery monitoring devices 30 to the correction mode has been completed.

At step S20, when the controller 14 determines that the frequency of the second clock signal is synchronized with the frequency of the first clock signal in all the battery monitoring devices 30 and the correction has been completed, i.e., the controller 14 determines true (T), the process proceeds to step S30. At step S20, when the controller 14 determines that the frequency of the second clock signal is not synchronized with the frequency of the first clock signal and the correction has not been completed, i.e., the controller 14 determines false (F), an operation at step S20 is repeated until the controller 14 determines true (T). It takes a certain period of time for the frequency of the second clock signal to be synchronized with the frequency of the first clock signal. Therefore, the controller 14 may determine that the determination at step S20 is false (F) until a certain period of time has passed since the first superimposed signal is returned from the final battery monitoring device 30 to the battery monitoring ECU 10. After the certain period of time has passed, the determination at S20 may be true (T).

At step S30, the controller 14 instructs all the battery monitoring devices 30 to transition to the measurement mode. More specifically, the controller 14 of the battery monitoring ECU 10 transmits a first superimposed signal as the mode switching instruction to the first battery monitoring device 30. The first superimposed signal is a signal in which battery monitoring information is superimposed, and the battery monitoring information includes an instruction causing the battery monitoring device 30 to monitor the battery cell. When the first battery monitoring device 30 transitions to the measurement mode, the second superimposed signal generated by the controller 48 of the first battery monitoring device 30 is transmitted to the second battery monitoring device 30. When the second battery monitoring device 30 transitions to the measurement mode, the second superimposed signal generated by the controller 48 of the second battery monitoring device 30 is transmitted to the third battery monitoring device 30. Similarly, the second superimposed signal is consecutively transmitted to the succeeding battery monitoring devices 30. When the second superimposed signal is returned from the final battery monitoring device 30 to the battery monitoring ECU 10, all the battery monitoring devices 30 has transitioned to the measurement mode. At step S40, the controller 14 decodes the second superimposed signal to acquire states of the monitored battery cells.

Figure 4:
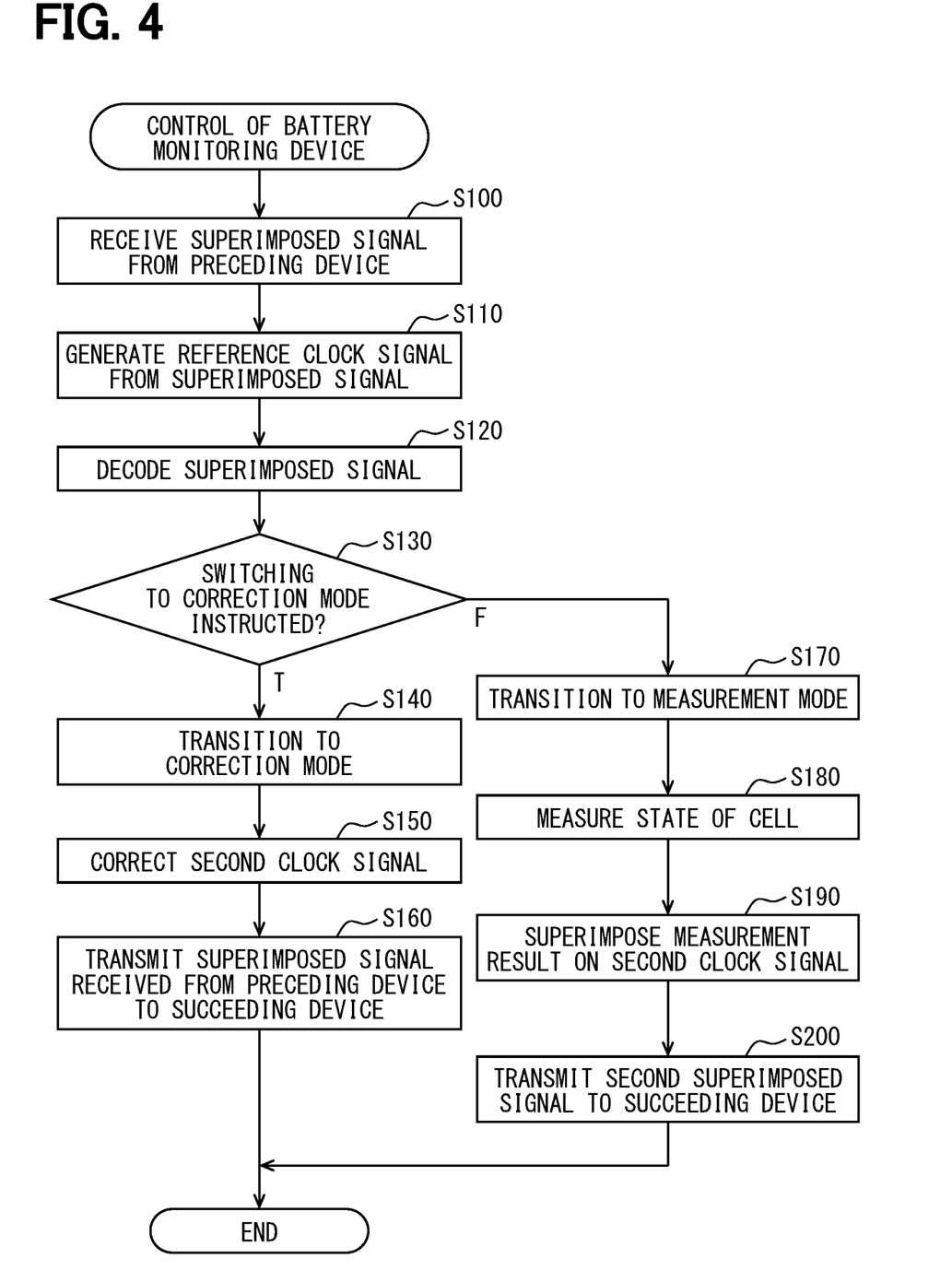
FIG. 4 is a flowchart of a process in a controller of a battery monitoring device.

FIG. 4 is a flowchart of a process in a controller 48 of a battery monitoring device 30. At step S100, the controller 48 receives the superimposed signal from the preceding device through the receiver 42. Here, when the battery monitoring device 30 is the first battery monitoring devices 30, the preceding device is the battery monitoring ECU 10. When the battery monitoring device 30 is one of second to mth battery monitoring devices 30, the preceding device is preceding one of the battery monitoring devices 30.

At step S110, the controller 48 generates the reference clock signal from the received superimposed signal. At step S120, the controller 48 decodes the superimposed signal to obtain the clock frequency information and the mode switching instruction. The mode switching instruction causing the battery monitoring device 30 to transition to the correction mode or the measurement mode. The controller 48 may execute the operation at either step S110 or S120 first. At step S130, the controller 48 determines whether the mode switching instruction is an instruction causing the battery monitoring device 30 to transition to the correction mode. When the mode switching instruction the instruction causing the battery monitoring device 30 to transition to the correction mode, i.e., a determination result is true (T), the process in the controller 48 proceeds to step S140. On the other hand, when the mode switching instruction is not the instruction causing the battery monitoring device 30 to transition to the correction mode, i.e., the determination result is false (F), the mode switching instruction is an instruction causing the battery monitoring device 30 to transition to the measurement mode, and the process proceeds to step S170.

At step S140, the controller 48 controls the battery monitoring device 30 to transition to the correction mode, and sets the switching signal Ss at "H" level. At step S150, the controller 48 controls the frequency correction block 52 to correct the frequency of the second clock signal generated by the second clock generator 50. At step S160, the controller 48 controls the switch 46 to transmit the superimposed signal received from the preceding device to the succeeding device. Thereby, the first superimposed signal is transmitted to the next battery monitoring device 30.

When the second clock signals of all the battery monitoring devices 30 are corrected and the frequencies of the second clock signals are synchronized with the frequency of the first clock signal, the battery monitoring ECU 10 causes the battery monitoring devices 30 to transition to the measurement mode.

The operations at steps S100, S110, S120, S130 in battery monitoring device 30 at the time of the battery monitoring ECU 10 causing the battery monitoring devices 30 to transition to the measurement mode are the same as those at the time of transition to the correction mode. However, since the determination result at step S130 is false (F), the battery monitoring device 30 performs an operation at step S170.

At step S170, the controller 48 controls the battery monitoring device 30 to transition to the measurement mode, and sets the switching signal Ss at "L" level. At step S180, the controller 48 causes the battery monitor 54 to acquire the state of the battery cell. At step S190, the controller 48 generates the second superimposed signal in which the clock frequency information, the instruction causing the battery monitoring device 30 to transition to the measurement mode, the battery monitoring information and the state of the battery cell which is a monitoring result are superimposed on the second clock signal. The state of the battery cell, which is the monitoring result, is successively added. That is, the second superimposed signal generated by the first battery monitoring device 30 includes the monitoring result of the battery cell of the first cell stack CS1. The second superimposed signal generated by the second battery monitoring device 30 includes the monitoring results of the battery cells of the first cell stack CS1 and the second cell stack CS2. The second superimposed signal generated by the x-th battery monitoring device 30 includes the monitoring results of the battery cells of from the first cell stack CS1 to the x-th cell stack CSx. At step S200, the controller 48 controls the switch 46 to transmit the second superimposed signal to the succeeding device. As a result, the second superimposed signal on which the measurement results up to the current battery monitoring device 30 are superimposed is transmitted to the next battery monitoring device 30.

Figure 5:
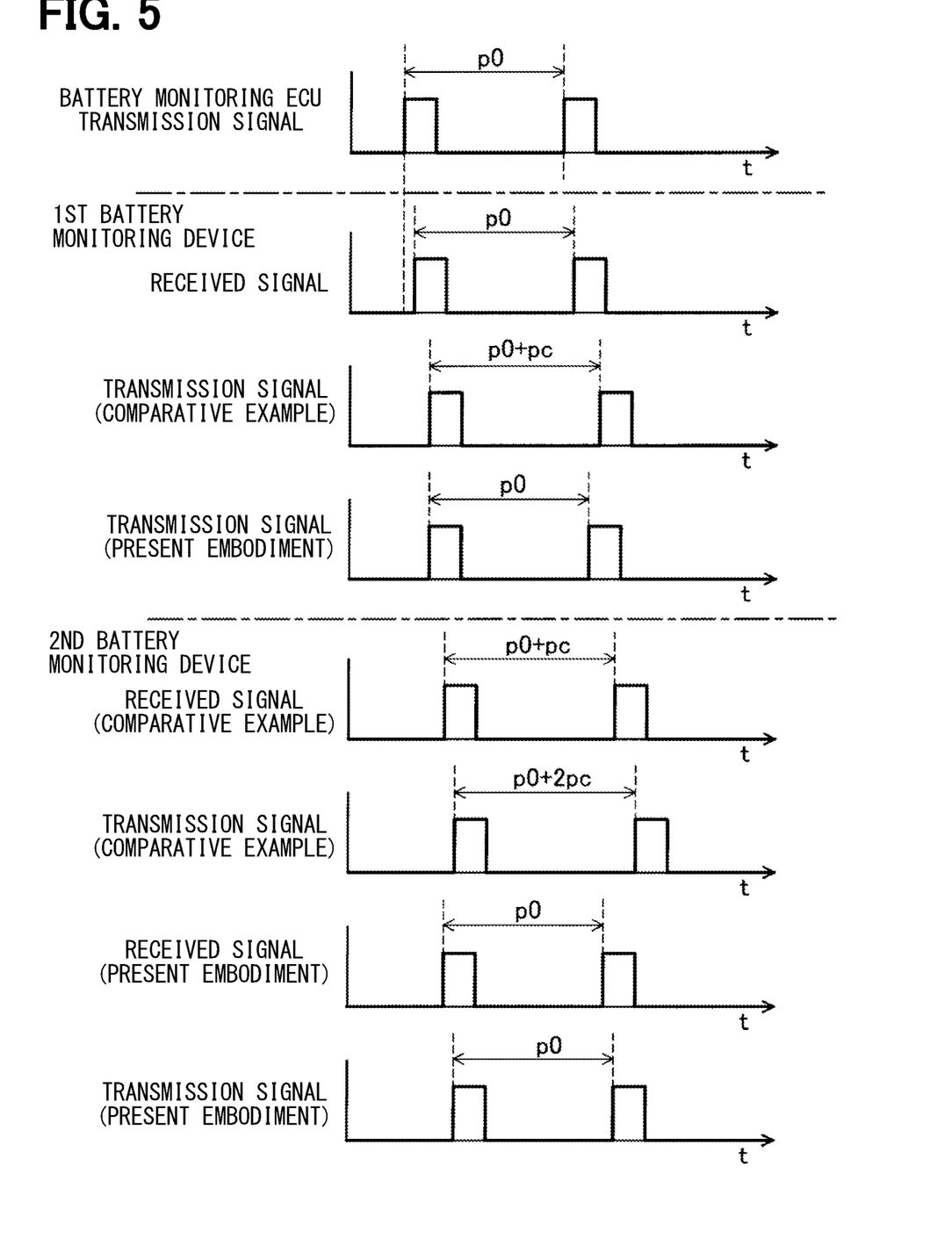
FIG. 5 is a diagram illustrating a period (i.e., 1/frequency) of a transmitted signal of a battery monitoring ECU, and periods of received and transmitted signals of each battery monitoring device in a measurement mode.

FIG. 5 is a diagram illustrating a period (i.e., 1/frequency) of a transmitted signal of the battery monitoring ECU 10, and periods of received and transmitted signals of each battery monitoring device 30 in the measurement mode. In a comparative example, the controller 48 of the battery monitoring device 30 does not perform the correction described in the present embodiment. The period of the first superimposed signal (first clock signal) transmitted by the battery monitoring ECU 10 is p0. The period of the first superimposed signal (first clock signal) received by the receiver 42 of the first battery monitoring device 30 is also p0. The period p1 of the second superimposed signal (second clock signal) transmitted by the transmitter 44 of the first battery monitoring device 30 is p0+pc, which is the period p0 of the battery monitoring ECU 10 plus an error pc. The period of the second superimposed signal (second clock signal) received by the receiver 42 of the second battery monitoring device 30 is also p0+pc. The period p2 of the second superimposed signal (second clock signal) transmitted by the transmitter 44 of the second battery monitoring device 30 is p1+pc, i.e., p0+2pc, which is the period p1 of the first battery monitoring device 30 plus the error pc. Therefore, the period px after the x-th battery monitoring device 30 is p0+xpc, and the errors are more accumulated in the succeeding devices, and the accumulated errors becomes maximum at the m-th battery monitoring device 30 which is the final battery monitoring device 30.

On the other hand, in the present embodiment, the controller 48 of the battery monitoring device 30 performs the correction. The period P1 of the second superimposed signal (second clock signal) transmitted by the transmitter 44 of the first battery monitoring device 30 is the same as the period p0 of the first superimposed signal (first clock signal) of the battery monitoring ECU 10. Also, the period of the second superimposed signal (second clock signal) received by the receiver 42 of the second battery monitoring device 30 and the period of the second superimposed signal (second clock signal) transmitted by the transmitter 44 of the second battery monitoring device 30 are the same as the period p0 of the first superimposed signal (first clock signal) of the battery monitoring ECU 10. In this way, the period, i.e., frequency of the second clock signal of each of the battery monitoring devices 30 is the same as the period, i.e., frequency of the first clock signal, and thereby frequency errors are not accumulated. The term "same" includes an error occurred in correction by the battery monitoring device 30.

As described above, according to the present embodiment, each of the battery monitoring devices 30 includes the switch 46 that, according to an instruction from the battery monitoring ECU 10, switches a circuit configuration to a state in which a signal transmitted from the preceding device is output to the succeeding device without using the second clock signal. As a result, the battery monitoring system 100 is capable of reducing accumulation of frequency errors and synchronizing the frequencies at low cost.

According to the present embodiment, the switch 46 switches the circuit configuration to the state in which a signal transmitted from the preceding device is output to the succeeding device only for a predetermined period, and switches the circuit configuration to a state in which a signal generated at the present device is output to the succeeding device for a period other than the predetermined period. As a result, the state of the battery cell monitored at the present device can be sent to the battery monitoring ECU 10 during the period other than the predetermined period.

According to the present embodiment, the battery monitoring device 30 includes the frequency correction block 52 that detects a frequency deviation between the reference clock signal (i.e., first clock signal) and the second clock signal and corrects the frequency of the second clock signal. Therefore, the frequency of the second clock signal can be corrected so that the frequency of the second clock signal approaches the frequency of the first clock signal.

According to the present embodiment, the frequency correction block 52 can detect the frequency deviation between the first clock signal and the second clock signal by various methods. For example, if the frequency correction block 52 employs a counter method that uses a count difference between the first clock signal and the second clock signal, the frequency deviation can be easily detected from the count difference. Further, the frequency correction block 52 may employ a phase-locked loop method or a delay-locked loop method.

According to the present embodiment, since the switch 46 is provided between the controller 48 and the receiver 42 and between the controller 48 and the transmitter 44, a strength of a signal that has passed through the switch 46 can be increased by the transmitter 44.

Second Embodiment

Figure 6:
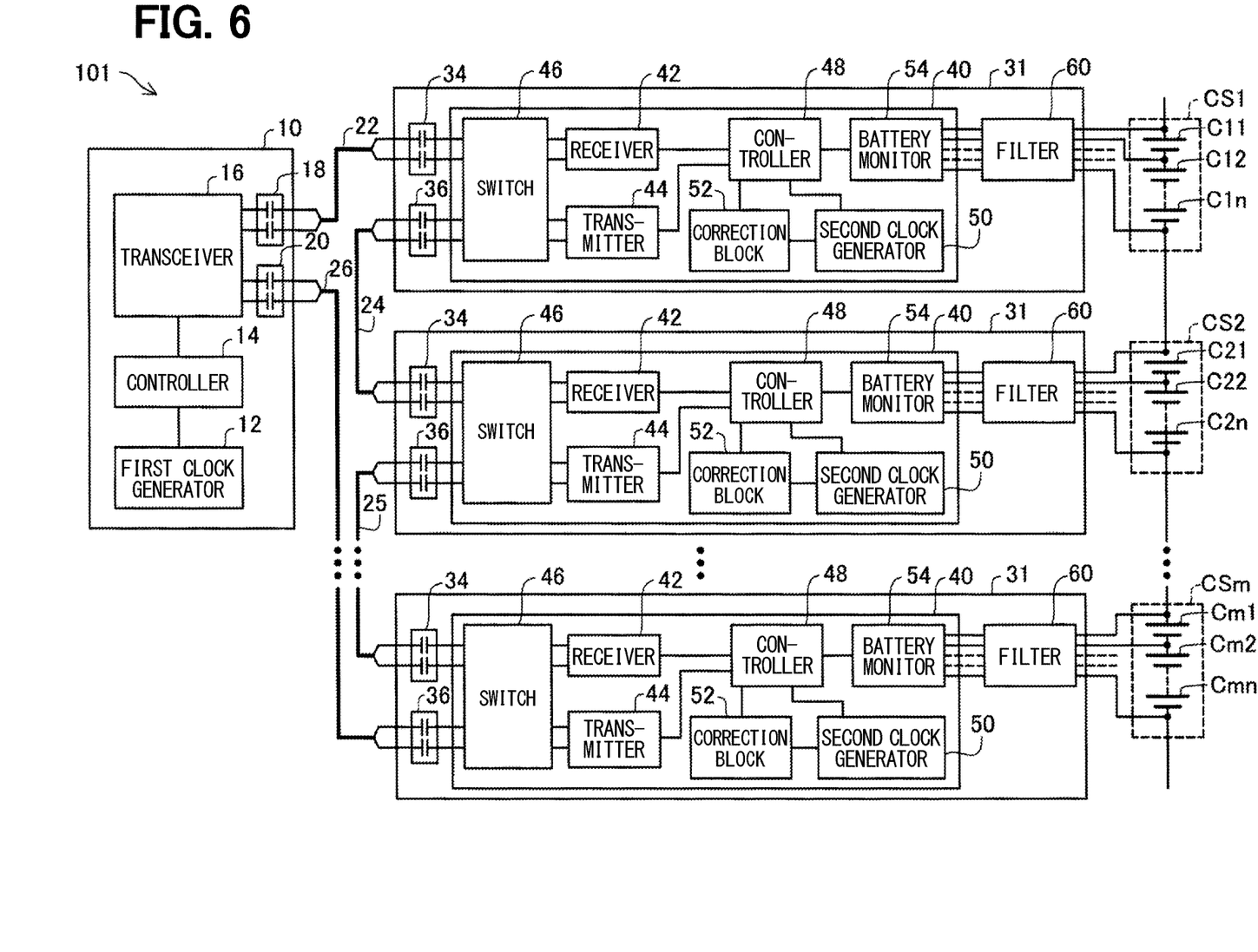
FIG. 6 is a schematic diagram illustrating a battery monitoring system according to a second embodiment.

FIG. 6 is a schematic diagram illustrating a battery monitoring system 101 according to a second embodiment. The second embodiment is different from the first embodiment in points described below. In the first embodiment, each of the battery monitoring devices 30 includes the switch 46 between the receiver 42 and the controller 48 and between the transmitter 44 and the controller 48. In the battery monitoring system 101 of the second embodiment, each of battery monitoring devices 31 includes a switch 46 between a connector 34 and the receiver 42 and between a connector 36 and the transmitter 44. Even in the second embodiment, operations are the same as the first embodiment. Therefore, similar to the first embodiment, reduction in accumulation of frequency errors and synchronization of frequencies of second clock signals can be achieved at low cost.

Third Embodiment

Figure 7:
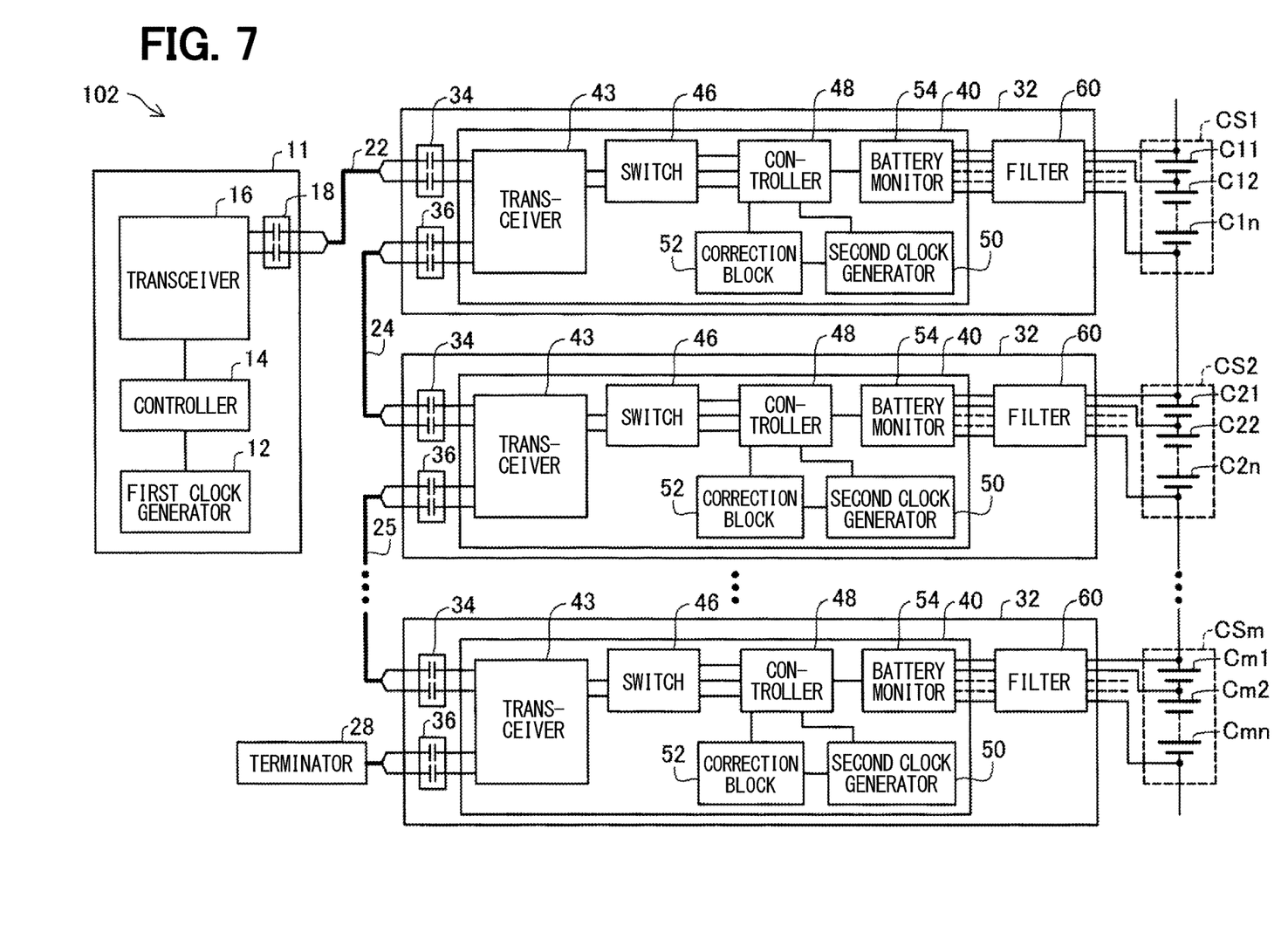
FIG. 7 is a schematic diagram illustrating a battery monitoring system according to a third embodiment.

FIG. 7 is a schematic diagram illustrating a battery monitoring system 102 according to a third embodiment. The third embodiment is different from the first embodiment in points described below. In the battery monitoring system 102 of the third embodiment, each of battery monitoring devices 32 includes a transceiver 43 instead of the receiver 42 and the transmitter 44 of the battery monitoring system 100 of the first embodiment, and the battery monitoring ECU 10 and the battery monitoring devices 32 are daisy-chained. Each of the battery monitoring devices 32 includes two connectors 34 and 36. A connector 36 of an m-th battery monitoring device 32 (i.e., final battery monitoring device) is connected to a terminator 28. The terminator 28 may not need to be connected to the connector 36 depending on a configuration of the transceiver 43. In the first embodiment, a connector 34 is used as the input, and a connector 36 is used as the output. However, in the third embodiment, a connector 34 functions as an input, and the connector 36 functions as an output. The connector 36 can be switched to function as an input, and the connector 34 can be switched to function as an output. In a correction mode, similar to the first embodiment, a first superimposed signal is consecutively transmitted from the first battery monitoring device 32 to the final battery monitoring device 32. Even in the third embodiment, operations in the correction mode are the same as the first embodiment. Therefore, similar to the first embodiment, reduction in accumulation of frequency errors and synchronization of frequencies can be achieved at low cost. In a measurement mode of the third embodiment, a second superimposed signal in which measurement results are superimposed is transmitted to the final battery monitoring device 32, then transmitted backward from the final battery monitoring device 32 to the first battery monitoring device 32, and finally transmitted to the battery monitoring ECU 10.

Fourth Embodiment

Figure 8:
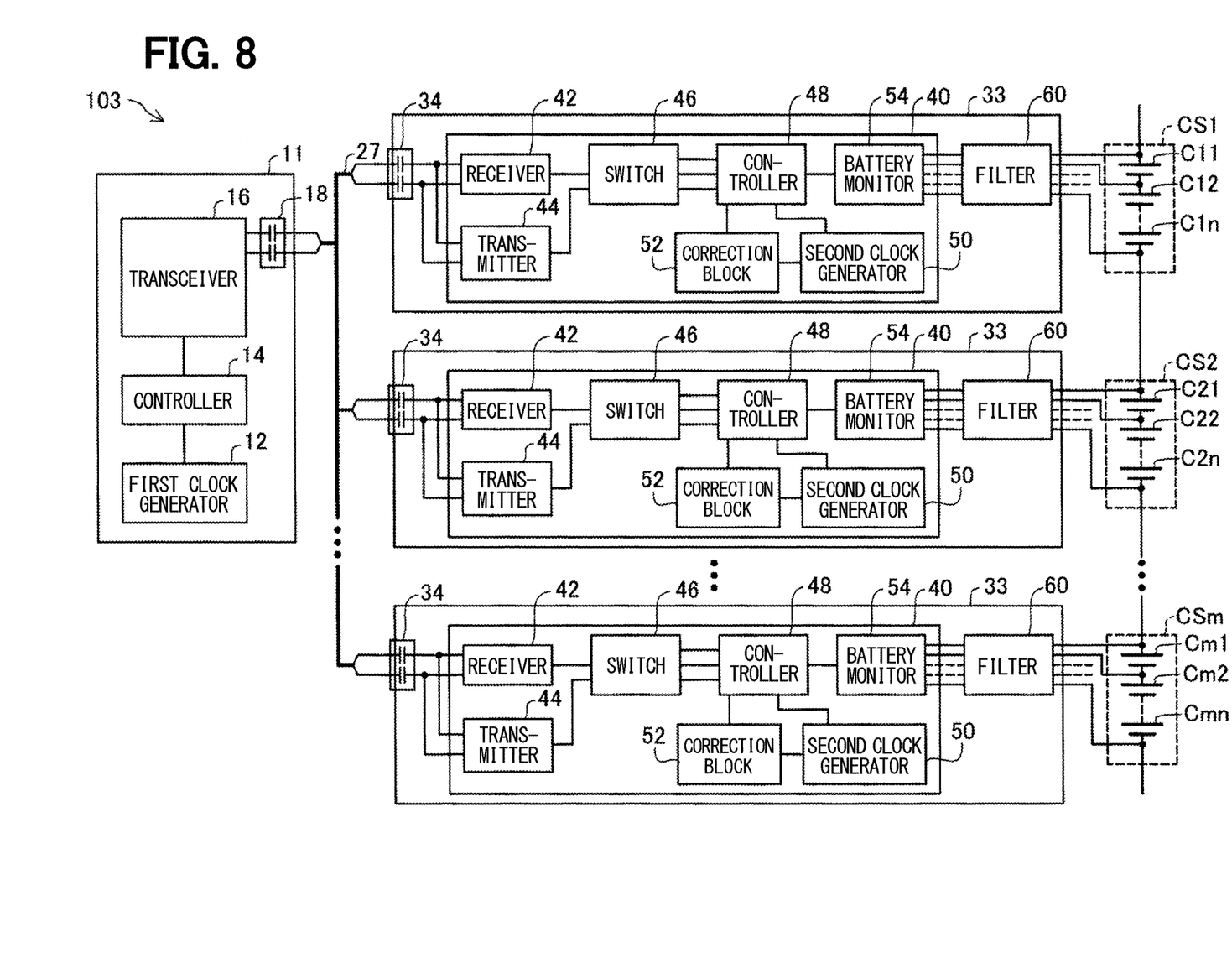
FIG. 8 is a schematic diagram illustrating a battery monitoring system according to a fourth embodiment.

FIG. 8 is a schematic diagram illustrating a battery monitoring system 103 according to a fourth embodiment. In the battery monitoring system 103 according to the fourth embodiment, battery monitoring devices 33 are connected to a battery monitoring ECU 11 via multi-drop connection. The transceiver 16 of the battery monitoring ECU 11 is connected to a transmission path 27 via a connector 18. In each of the battery monitoring devices 33, a receiver 42 and a transmitter 44 are connected to one connector 34, and the connector 34 is connected to the transmission path 27.

In the battery monitoring system 103 according to the fourth embodiment, a signal from the battery monitoring ECU 11 is transmitted to the receiver 42 of the first battery monitoring device 33 via the connector 18 and the transmission path 27. A signal output from the transmitter 44 of the first battery monitoring device 33 is transmitted to a receiver 42 of the next battery monitoring device 33, i.e., the second battery monitoring device 33 via the connectors 34 and the transmission path 27. Similarly, a signal output from a transmitter 44 of the x-th battery monitoring device 33 is transmitted to a receiver 42 of the next battery monitoring device 33, i.e., the (x+1)-th battery monitoring device 33 via the connecting part 34 and the transmission path 27. A signal output from the transmitter 44 of the final battery monitoring device 33, i.e., the mth battery monitoring device 33 is transmitted to the transceiver 16 of the battery monitoring ECU 11 via the connector 34 and the transmission path 27. In this manner, each of the battery monitoring devices 33 sequentially transmits the superimposed signal by using the same transmission path 27. Regarding the transmission, each of the battery monitoring devices 33 sequentially transmits the superimposed signal to the succeeding device with a right of use of the transmission path 27 by using a token.

Even in the fourth embodiment, operations are the same as the first embodiment. Therefore, similar to the first embodiment, reduction in accumulation of frequency errors and synchronization of frequencies can be achieved at low cost.

As can be seen from the first to fourth embodiments, the connection configuration of the battery monitoring ECU and the multiple battery monitoring devices can be various connection configuration such as ring connection, daisy chain connection, and multi-drop connection.

Fifth Embodiment

Figure 9:
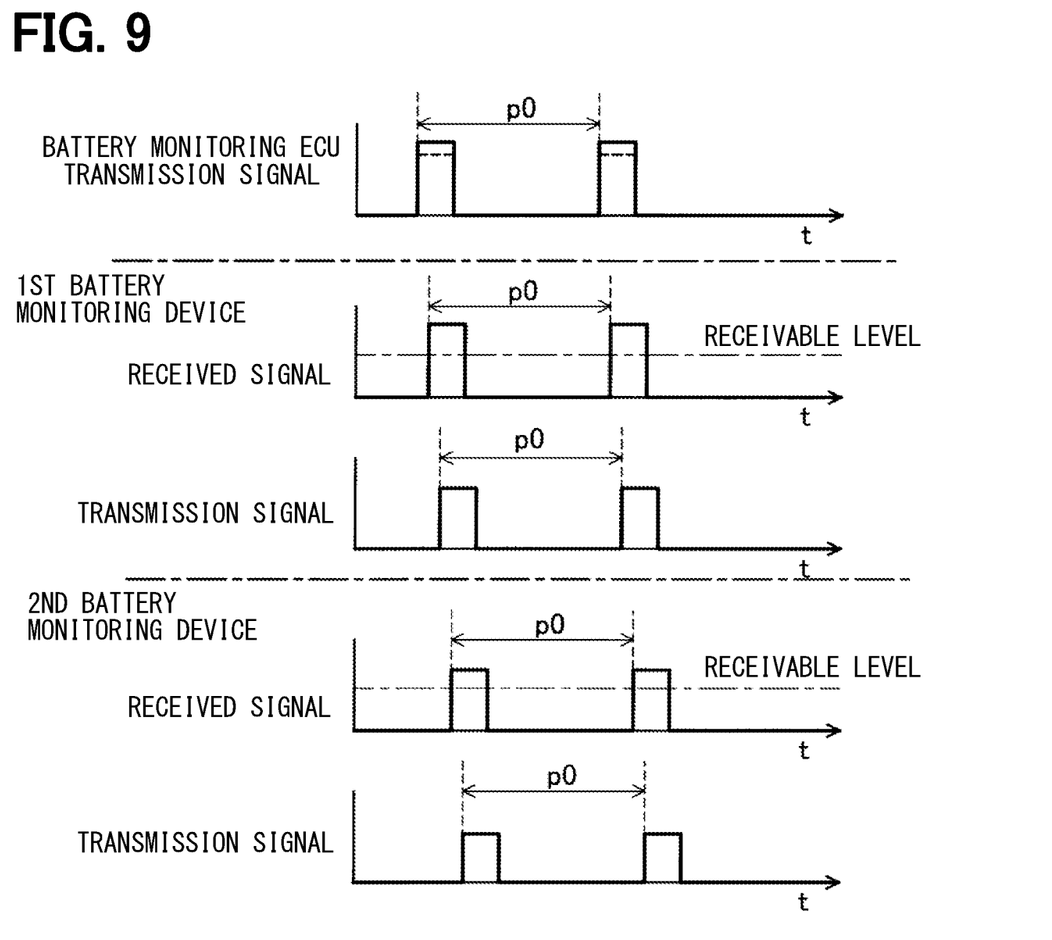
FIG. 9 is a diagram illustrating a first superimposed signal transmitted by a battery monitoring ECU in a correction mode and a first superimposed signal received and transmitted by each battery monitoring device, according to a fifth embodiment.

FIG. 9 is a diagram illustrating a first superimposed signal transmitted by a battery monitoring ECU 10 in a correction mode and a first superimposed signal received and transmitted by each battery monitoring device 30, according to a fifth embodiment. When a first superimposed signal passes through a selector 47 of a switch 46, an on-resistance of the selector 47 reduces the voltage. A battery monitoring ECU 10 in the fifth embodiment sets a signal level of the first superimposed signal high so as to exceed a signal level at which a signal is receivable by the receiver 42 of any of the battery monitoring devices 30. As a result, although the signal level of the first superimposed signal decreases at the time of passing through each of the battery monitoring devices 30, the signal level can be detected by the receiver 42 of the final battery monitoring device 30.

Sixth Embodiment

Figure 10:
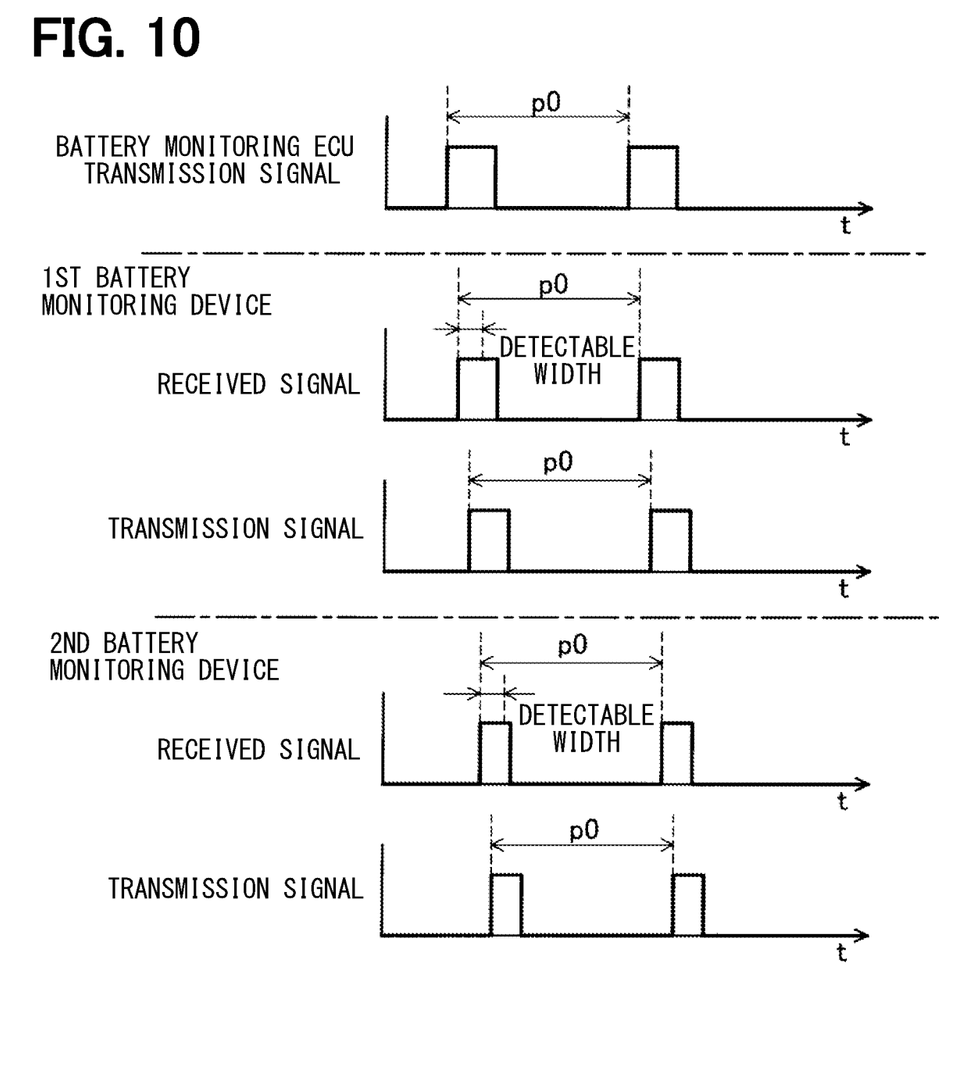
FIG. 10 is a diagram illustrating a first superimposed signal transmitted by a battery monitoring ECU in a correction mode and a first superimposed signal received and transmitted by each battery monitoring device, according to a sixth embodiment.

FIG. 10 is a diagram illustrating a first superimposed signal transmitted by a battery monitoring ECU 10 in a correction mode and a first superimposed signal received and transmitted by each battery monitoring device 30, according to a sixth embodiment. When a first superimposed signal passes through a selector 47 of the switch 46, a pulse width is narrowed by H and L determination thresholds in the selector 47. The battery monitoring ECU 10 of the sixth embodiment widens the pulse width of the first superimposed signal so as to exceed a pulse width level at which a pulse is detectable by the receiver 42 of any of battery monitoring devices 30. As a result, although the pulse width of the first superimposed signal decreases at the time of passing through each of the battery monitoring devices 30, the pulse can be detected by the receiver 42 of the final battery monitoring device 30.

In each of the above embodiments, the battery monitor 54 monitors the battery cell using the second clock signal that has been corrected. However, the battery monitor may perform the monitoring without using the second clock signal, or may perform the monitoring using the second clock signal that has not been corrected.

The present disclosure is not limited to the above embodiments, and can be achieved by various configurations without departing from the scope of the present disclosure. For example, the technical features in each embodiment corresponding to the technical features can be appropriately replaced or combined in order to solve a part or all of the above-described problems or achieve a part or all of the above-described effects. Also, some of the technical features may be omitted as appropriate.

The controllers and methods described in this application may be fully implemented by a special purpose computer created by configuring a processor programmed to execute one or more particular functions embodied in computer programs. Alternatively, the apparatuses and methods described in this application may be fully implemented by special purpose hardware logic circuits. Further alternatively, the apparatuses and methods described in this application may be implemented by a special purpose computer created by a combination of a processor executing computer programs coupled with hardware logic circuits.

While the present disclosure has been described with reference to embodiments thereof, it is to be understood that the disclosure is not limited to the embodiments and constructions. To the contrary, the present disclosure is intended to cover various modification and equivalent arrangements. In addition, while the various elements are shown in various combinations and configurations, which are exemplary, other combinations and configurations, including more, less or only a single element, are also within the spirit and scope of the present disclosure.

What is claimed is:

1. A battery monitoring system for monitoring states of battery cells, the battery monitoring system comprising a battery monitoring electronic control unit (ECU) and battery monitoring devices, wherein
    the battery monitoring ECU and the battery monitoring devices are connected in a connection configuration which is ring connection, daisy chain connection, or multidrop connection,
    the battery monitoring ECU includes:
        a clock generator configured to generate a first clock signal; and
        a transceiver configured to:
            transmit a signal from which the first clock signal is specified and an instruction regarding monitoring of the battery cells to at least one of the battery monitoring devices; and
            receive a result of the instruction from at least one of the battery monitoring devices, and
    each battery monitoring device includes:
        a receiver configured to receive a signal from a preceding device in the connection configuration;
        a second clock generator configured to generate a second clock signal used as a reference of an operation of the battery monitoring device;
        a frequency correction block configured to correct a frequency of the second clock signal;
        a battery monitor configured to monitor a battery cell using the second clock signal;
        a controller configured to:
            cause the frequency correction block to correct the frequency of the second clock signal in line with the first clock signal according to the signal received via the receiver; and
            cause the battery monitor to monitor the battery cell using the second clock signal that has been corrected by the frequency correction block;
        a transmitter configured to transmit a monitoring result of the battery cell to a succeeding device in the connection configuration; and
        a switch configured to, according to the instruction from the battery monitoring ECU, switch a circuit configuration to a state in which a signal received from the preceding device is transmitted to the succeeding device.

2. The battery monitoring system according to claim 1, wherein
    the switch of each battery monitoring device, according to the instruction from the battery monitoring ECU, is configured to switch the circuit configuration between the state in which a signal received from the preceding device is transmitted to the succeeding device and a state in which a signal generated in the battery monitoring device is transmitted to the succeeding device.

3. The battery monitoring system according to claim 1, wherein
    the switch of each battery monitoring device, according to the instruction from the battery monitoring ECU, is configured to switch the circuit configuration to the state in which a signal received from the preceding device is transmitted to the succeeding device only for a predetermined period, and switch the circuit configuration to a state in which a signal generated at the battery monitoring device is transmitted to the succeeding device for a period other than the predetermined period.

4. The battery monitoring system according to claim 2, wherein
    the frequency correction block is configured to detect a frequency deviation between a signal received from the preceding device and the second clock signal, and correct the frequency of the second clock signal based on the frequency deviation.

5. The battery monitoring system according to claim 4, wherein
    the frequency correction block is configured to detect a frequency deviation between the first clock signal and the second clock signal by any one of methods: a counter method using a count difference between a signal received from the preceding device and the second clock signal; a phase-locked loop method; and a delay-locked loop method.

6. The battery monitoring system according to claim 1, wherein
    the switch is provided between the receiver and the preceding device and between the transmitter and the succeeding device.

7. The battery monitoring system according to claim 1, wherein
each battery monitoring device transmits a signal to the succeeding device while the connection configuration is maintained by the switch and clock frequency information is maintained.

8. The battery monitoring system according to claim 7, wherein
the transceiver is configured to set a signal level of the first clock signal such that the first clock signal is detectable in the battery monitoring devices succeeding the battery monitoring ECU in the connection configuration.

9. The battery monitoring system according to claim 7, wherein
the transceiver is configured to set a pulse width of the first clock signal such that the first clock signal is detectable in the battery monitoring devices succeeding the battery monitoring ECU in the connection configuration.

* * * * *